(12) United States Patent
Roeck

(10) Patent No.: US 7,123,732 B2
(45) Date of Patent: Oct. 17, 2006

(54) PROCESS TO ADAPT THE SIGNAL AMPLIFICATION IN A HEARING DEVICE AS WELL AS A HEARING DEVICE

(75) Inventor: Hans-Ueli Roeck, Hombrechtikon (CH)

(73) Assignee: Phonak AG, Stafa (CH)

( * ) Notice: Subject to any disclaimer, the term of this patent is extended or adjusted under 35 U.S.C. 154(b) by 192 days.

(21) Appl. No.: 10/238,374

(22) Filed: Sep. 10, 2002

(65) Prior Publication Data

US 2004/0047480 A1 Mar. 11, 2004

(51) Int. Cl.
*H04R 25/00* (2006.01)
(52) U.S. Cl. ..................... 381/321; 381/320
(58) Field of Classification Search ............... 381/312, 381/314, 316, 317, 57, 104, 107, 109, 23.1, 381/71.6, 320, 321, 322, 328; 379/392.01; 702/57
See application file for complete search history.

(56) References Cited

U.S. PATENT DOCUMENTS

| | | | | |
|---|---|---|---|---|
| 5,615,256 A | * | 3/1997 | Yamashita | .................. 381/107 |
| 5,867,581 A | * | 2/1999 | Obara | ........................ 381/312 |
| 5,903,655 A | | 5/1999 | Salmi et al. | |
| 6,885,752 B1 | * | 4/2005 | Chabries et al. | ............. 381/321 |

| | | | |
|---|---|---|---|
| 2002/0118851 A1 | * | 8/2002 | Paludan-Mueller ......... 381/317 |

FOREIGN PATENT DOCUMENTS

| | | |
|---|---|---|
| CA | 2 090 531 A | 8/1994 |
| WO | 99/34642 | 7/1999 |
| WO | 01/76063 A2 | 10/2001 |

OTHER PUBLICATIONS

Stone M. A. et al: "Comparison of different forms of compression using wearable digital haring aids" Journal of the Acoustical Society of America, Dec. 1999, Acoust. Soc. America Through AIP, USA, bd. 106, Nr. 6, Seiten 3603-3619, XP001162751, ISSN: 0001-4966.

* cited by examiner

*Primary Examiner*—Sinh Tran
*Assistant Examiner*—Brian Ensey
(74) *Attorney, Agent, or Firm*—Pearne & Gordon LLP

(57) ABSTRACT

A input signal for a hearing device signal processing unit is generated with the aid of an electro-acoustic converter. An output signal is generated by applying signal amplification. The signal amplification is adapted by determining a reference level of the input signal using statistical calculation methods. A minimum input signal level is determined by subtracting a predefined difference value from the reference level of the input signal. An amplification function is applied to the input signal when the signal level is less than the minimum input signal level. This amplification function is different from an amplification function applied when the signal level is greater than the minimum input signal level.

22 Claims, 2 Drawing Sheets

PROCESS TO ADAPT THE SIGNAL AMPLIFICATION IN A HEARING DEVICE AS WELL AS A HEARING DEVICE

TECHNICAL FIELD

The present invention is related to a process to adapt signal amplification in a hearing device in which an input signal for a signal processing unit is generated with the aid of an electro-acoustic converter, and in which hearing device an output signal is determined by the signal amplification, as well as a hearing device.

BACKGROUND OF THE INVENTION

Known amplification models for hearing devices have fixed limits for the input level, below which a squelch is applied. In fact, input signals with levels that lie below a predetermined limit will be basically reduced or amplified in a reduced manner, respectively, compared to input signals with levels that lie above a predetermined limit. From this measure, it arises that background noise will not be amplified or only in a reduced manner. As a result thereof, the hearing device user will not be disturbed by excessive amplified background noise, which basically contains no useful information.

A known amplification course is represented in FIG. 1, in which the amplification G is represented as a function of the level S. The amplification G as well as the level S of the input signals are given in the unit decibel (dB). From the course for the amplification G represented in FIG. 1 three ranges I, II and II can be identified, of which the known squelch lies in range I, of which the normal operating range lies in range II and of which an output level limiting is applied in range III. The slope of the course of the amplification G in range II corresponds to a compression needed for the compensation of a hearing loss. In contrast thereto, it is omitted by the course of the amplification G in the range I that surrounding noise will be amplified in correspondence to the particular level, which surrounding noise basically contains no information for the hearing device user. Thereby, it is of importance what value is assigned to a first limit between the range I and II, which limit will be called first knee point $S_{KP1}$ in the following. In case the value for the first knee point $S_{KP1}$ is chosen to be too high, the comprehensibility of spoken words will be reduced in very quiet surroundings. In case the value for the first knee point $S_{KP1}$ is in turn chosen to be too low, interference noise, on the other hand, will not be suppressed enough.

In an analogous manner, the upper limit, which will be identified as second knee point $S_{KP2}$ in the following, will be fixed between the ranges II and III, the input signals having higher levels as the second knee point $S_{KP2}$ being limited because one assumes that input signals with higher values than the second knee point $S_{KP2}$ are felt as painful for the hearing device user, when such input signals are applied, resulting from the amplification applied to the corresponding input level, from which the output level results.

For more progressive algorithms, for which a so-called two-path system with two time constants is applied instead of the above mentioned one-path system, basically the same disadvantage is obtained. The known processes are based on two time constants, namely on a long time constant of typically several seconds and on a short time constant of typically several dozens of milliseconds. While the average amplification is adjusted over the long time constant, the actual syllabic compression is adjusted over the short time constant. Both paths will be added such that in the end the fast path with the short time constant is superimposed over the slow path which determines the actual operating point. The connection is thereby obtained over the operating point determined by the slow path.

A possible course of signal amplification for such a two path system is represented in FIG. 2. On the horizontal and vertical axes, the same values have again been entered in the same unit as in FIG. 1. While the course of the slow path is denoted by $G_{slow}$, which sets the actual operating point $A_1$, $A_2$ or $A_3$, the fast path is denoted by $G_{fast1}$ or $G_{fast2}$ or $G_{fast3}$, in which the syllabic compression takes place.

The one-path as well as the two-path system incorporate enormous problems, if the acoustic situation changes. In other words, the known systems can only very badly adapt to changing acoustic situations.

A one-path system can either incorporate a syllabic compression or an automatic volume control (AVC), but not both. The known one-path system has been extensively described by Brian C. J. Moore in his book entitled "Perceptual consequences of cochlear damage" (ISBN 0 19 852330 0, pages 179 to 189).

The two-path system also profits by a reduced amplification below the first knee point $S_{KP1}$ if the input level is low for a long time. For short speech breaks, the known two-path system cannot reduce the amplification in a sensible manner therefore. If, in a fast path of a two-path system, on the other hand, a further fixed knee point is also introduced with reduced amplification of small input levels, the knee point level for very quiet or very loud signals is adjusted in a wrong manner, i.e. the speech information will not be amplified enough, or noise is amplified too strong. The known two-path systems have been extensively described by Michael Stone et al. in the paper entitled "Comparison of different forms of compression using wearable digital hearing aids" (J. Acoust. Soc. Am. 106(6), December 1999, pages 3603 to 3609).

Therefore, it is an object of the present invention to provide a method for which the disadvantages mentioned above do not occur.

SUMMARY OF THE INVENTION

A Method to adapt a signal amplification in a hearing device, in which with the aid of an electro-acoustic converter an input signal is generated for a signal processing unit, and in which hearing device an output signal is determined over the signal amplification. The method comprises the steps of determining a reference level of the input signal by using statistical calculation methods, by determining a minimum input signal level by subtracting a predefined difference value from the reference level of the input signal, and, finally, by applying an amplification function to the input signal with a signal level which lies below the minimum input signal level, the amplification function being different from the one applied above the minimum input signal level.

The present invention has the following advantages: By adaptively adjusting the minimum input level in function of the reference level of the input signal, the changing situations are taken into account, which changing situations, for example, consist in changing noise scenery or in a changing volume of a speaker. As a result thereof, improved noise suppression and an increase of the hearing ability are obtained.

The method according to the present invention bears the result that unwanted background noise is fundamentally better suppressed than by using a known statistical system.

In contrast to the known noise suppression algorithms, estimation of the local signal to noise ratio will not be carried out as e.g. for the spectral subtraction, but a noise suppression will be realized over an evaluation of the long-time behavior of the input signal level, should the case arise, in certain frequency bands. Thereby, the fact is being used that speech signals have a defined dynamic range around a mean level. Signal levels, which lie above or below the said range, can be identified as noise signals and can therefore be eliminated readily.

BRIEF DESCRIPTION OF THE DRAWINGS

The present invention will be further explained by referring to drawings showing exemplified embodiments of the present invention. It is shown in.

DETAILED DESCRIPTION OF THE INVENTION

Figure 3:
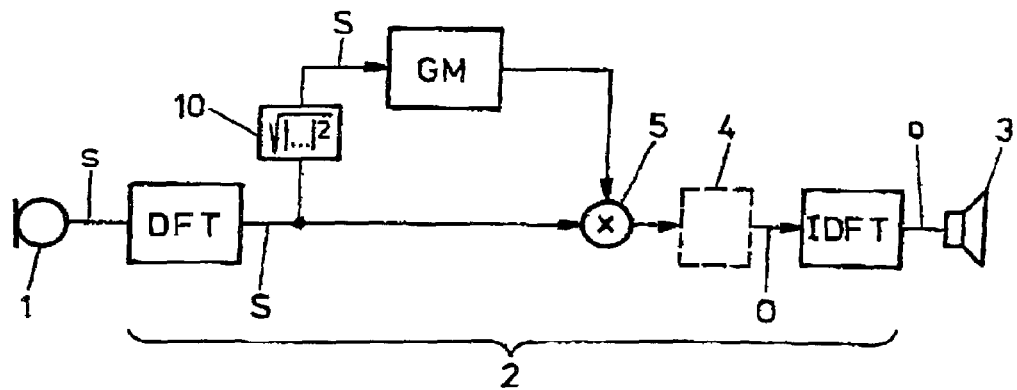

In FIG. 3, a block diagram of a hearing device is represented, which hearing device comprises an electro-acoustic converter 1 by which acoustic signals are converted into electrical signals, hereinafter referred to as input signal s, a signal processing unit 2 to which the input signal s is fed as well as a loudspeaker unit 3, which is often referred to as receiver in this technical field.

The one-path and two-path systems described above are being used, on the one hand, in hearing devices which are used to correct a hearing impairment of a patient, On the other side, the systems described above are also used as hearing aid devices in order to improve the hearing in special situations, as e.g. in bugging systems. Therefore, it is understood that in the following under the term "hearing device" all possible usages in connection with a better hearing must be understood, independent on the fact whether the used device is fully or just partly entered into the ear canal, which is the case for the so-called BTE (Behind The Ear) or CIC (Completely In the Canal) hearing devices, or whether the used devices are or have been implanted into the human body.

In the signal processing unit 2 according to FIG. 3, the signals will be preferably processed in digital form, such that analogue to digital converters or digital to analogue converters, respectively, must be provided in addition to the represented processing units. Furthermore, the processing of the signals takes place in the frequency domain for the embodiment represented in FIG. 3. An analogous embodiment is obtained by a further embodiment in which the signals are being processed in the time domain. The transfer of the embodiment represented in FIG. 3 in a form in which all signals are in the time domain, in which they are processed, can be easily realized by someone with basic knowledge in signal processing.

For a processing in the frequency domain, the input signal s is fed to a transformation unit DFT which can be seen from FIG. 3, in which transformation unit DFT the level S is determined as a function of the frequency. In the transformation unit DFT, the so-called Fast Fourier Transformation is preferably being used. It goes without saying that also other transformation algorithms or other filter banks can be used. In the following, the input signal s is fed to a first input of a multiplication unit 5 as well as to a calculation unit 10 in which the signal level S will be determined for example as RMS (Root Mean Square) level. The output signal of the calculation unit 10 will be fed to an amplification unit GM, which output signal is fed to a second input of the multiplication unit 5 such that the output signal of the multiplication unit 5, i.e. the level O of the output signal, will be affected by an amplification model implemented in the amplification unit GM, which model will be further explained in detail in the following. Before returning to the time domain by a back transformation unit IDFT, it is feasible that further processing steps will be implemented in an operation unit 4. Such a further processing step can e.g. be a limiting of the level of the output signal to a maximum value.

Finally, the output signal o of the back transformation unit IDFT is fed to the loudspeaker unit 3 in which a corresponding acoustic signal will be generated. For not implantable hearing devices, this acoustic signal will be transferred into the ear canal of the hearing device user. For implantable hearing devices, the loudspeaker unit 3 will be omitted. The acoustic stimulation will be performed in a different manner, namely by transforming the output signal o into another signal which can be perceived by the human body.

By referring to FIG. 4, the method according to the present invention will now be explained, which method is basically implemented in the amplification unit GM, whereby a two-path system will be used for the explanations.

Figure 1:
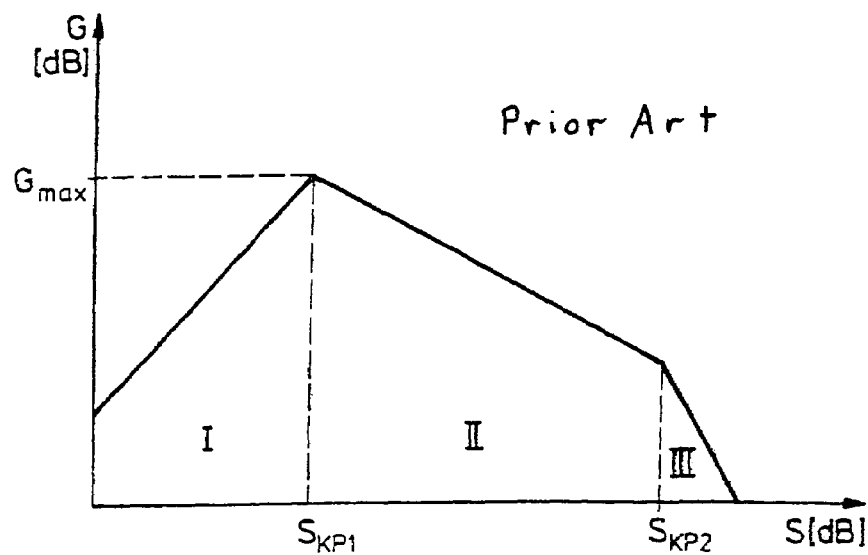
FIG. 1 a known piecewise linear amplification course for a one-path system.
Figure 2:
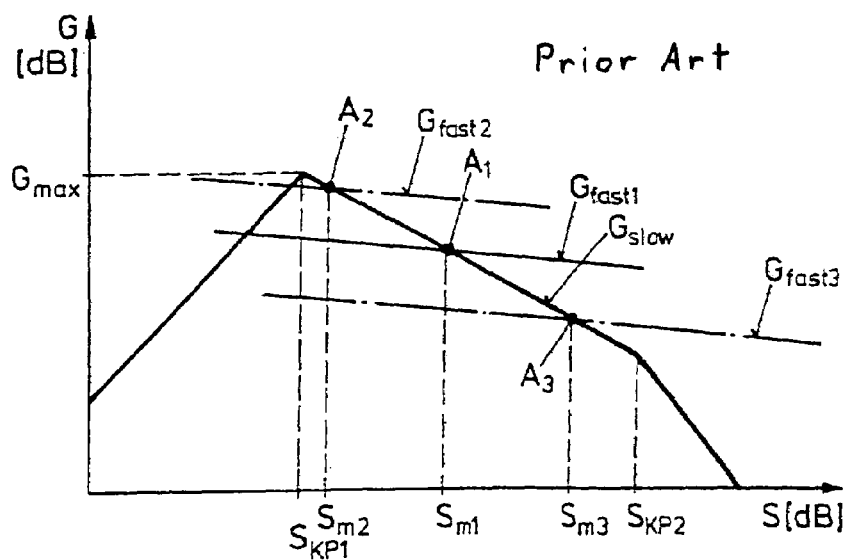
FIG. 2 a known amplification course for a two-path system comprising a slow and a fast path, FIG. 3 a block diagram of a hearing device, and FIG. 4 an amplification course according to the present invention for a two-path system.
Figure 4:
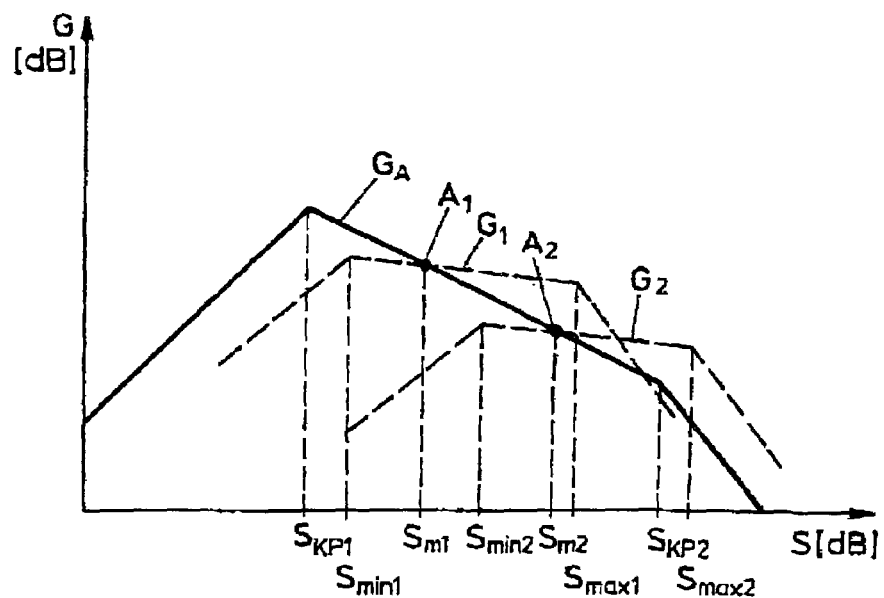

FIG. 4 shows, by a solid line, an amplification course of a slow path as a function of the level S of the input signal s. As for the known system which has been explained along with FIG. 2, the mean level $S_m$ of the input signal s will be determined by a time constant of several seconds. A momentary mean value for level $S_m$ of the input signal s thereby fixes a momentary operation point as is illustrated, for example, by two different operating points $A_1$ and $A_2$ in FIG. 4. In the momentary operation point $A_1$ or $A_2$, respectively, a specific syllabic compression becomes effective over a second fast path as it is indicated by a dashed line for the amplification courses $G_1$ and $G_2$. In contrast to the known method described along with FIGS. 1 and 2, the amplification course will now be adapted in relation to the fast path, according to the invention, in such a way that below a minimum input signal level $S_{min1}$ or $S_{min2}$, which lies by a predefined first difference value $\Delta_{min}$ below the momentary mean level $S_{m1}$ or $S_{m2}$, respectively, of the input signal s, a squelch is applied. Generally, the course of amplification or the amplification function, respectively, for lower input signal levels S as the minimum input signal level $S_{min1}$ or $S_{min2}$, respectively, is different from the one applied above the minimum input signal level $S_{min1}$ or $S_{min2}$. According to the amplification course $G_1$ and $G_2$ represented in FIG. 4 for the syllabic compression, i.e. for the fast path, the amplification courses $G_1$ and $G_2$ drop below the minimum input signal level $S_{min1}$ or $S_{min2}$, respectively, preferably in a linear manner, in other words, the signal levels will be less amplified, which signal levels lie below the minimal input levels $S_{min1}$ or $S_{min2}$, respectively, as others. Thereby, the amplification courses $G_1$ and $G_2$ pick up the corresponding courses in the compression range, preferably without discontinuity. The syllabic compression has a piecewise linear course over the whole level range of the input signal s in a specific embodiment of the present invention.

In a further embodiment of the present invention, it is additionally provided that a maximum input signal level $S_{max1}$ or $S_{max2}$, respectively, will be determined for each amplification course $G_1$ or $G_2$, respectively, above which maximum input signal level $S_{max1}$ or $S_{max2}$ a signal limiting is provided. The maximum input signal level $S_{max1}$ or $S_{max2}$, respectively, thereby lies above the momentary mean level $S_{m1}$ or $S_{m2}$, respectively, of the input signal s by a predefined difference value $\Delta_{max}$. Generally, the course of amplification or the amplification function, respectively, for higher input signal levels S as the maximum input signal level $S_{max1}$ or $S_{max2}$, respectively, is different from the one applied below the maximum input signal level $S_{max1}$ or $S_{max2}$. According to the amplification course $G_1$ and $G_2$ for the syllabic compression represented in FIG. 4, i.e. in the fast path, the amplification courses $G_1$ and $G_2$ drop above the maximum input signal level $S_{max1}$ or $S_{max2}$, respectively, for example in a linear manner, in other words the signal level, which lie above the maximum input level $S_{max1}$ or $S_{max2}$, respectively, as others, will be less amplified. Thereby, the amplification courses $G_1$ and $G_2$ pick up the corresponding courses in the compression ranges, preferably without discontinuity. The syllabic compression has a piecewise linear course over the whole level range of the input signal s in a specific embodiment of the present invention.

It is emphasized that the topic "signal limiting" has been made the object of a further international patent application of the same applicant, which international patent application has a publication number WO 01/76 063 A3. The method described therein can very well be used in combination with the described adaptive squelch. Therefore, the content of WO 01/76 063 A3 is herewith integrated by reference and part of this specification.

In order to chose the correct minimum and maximum input signal level $S_{min1}$ and $S_{max1}$, or $S_{min2}$, and $S_{max2}$, respectively, the fact is taken into account that the human speech has a dynamic range of approx. −15 to +18 dB (decibel) around a mean level $S_m$. In a quiet surrounding, i.e. for little surrounding noise, the mean level is approx. 60 to 65 dB For a loud surrounding, the mean level can reach approx. 80 dB. Given these facts, the first predefinable difference value $\Delta_{min}$ is preferably chosen to be equal to 15 dB, and the second predefinable difference value $\Delta_{max}$ is preferably chosen equal to 18 dB.

The explanation mentioned above in connection with FIG. 4 refers to a two-path system for which the minimum, if necessary in addition also the maximum, level $S_m$ of the input signal s will be adaptively adjusted. In analogous manner, the invention can be transferred to a one-path system for which the only knee point, i.e. the only minimum input signal level, is adaptively adjusted as a function of the mean level of the input signal.

Independent of the embodiment mentioned above, the estimation of the mean level can either be done in a broad frequency band, or several frequency bands can defined, whereas it is feasible that in each of the frequency bands individual knee points, i.e. minimum and, if need be, maximum input signal levels, are being determined by using an individual local statistic.

It is emphasized that whenever the term "mean level" is being used any reference level must be understood which has been calculated by any statistic.

It is also feasible, and to be precise again in combination with all embodiments of the present invention mentioned above, that the amplification course below the minimum input signal level of the slow path is selected to be different compared to the amplification course of the fast path. It is understood that it is possible that in one path a linear amplification course is provided and in another a compressive or an expansive amplification course, respectively, is provided.

The invention claimed is:

1. A method to adapt a signal amplification in a hearing device, in which with the aid of an electro-acoustic converter an input signal is generated for a signal processing unit, and in which hearing device an output signal is generated by applying the signal amplification, the method comprises the steps of
    determining a reference level of the input signal by using statistical calculation methods,
    determining a minimum input signal level by subtracting a predefined difference value from the reference level of the input signal,
    applying an amplification function to the input signal with a signal level which lies below the minimum input signal level, the amplification function being different from the one applied above the minimum input signal level,
    using the reference level of the input signal to determine an operating point of a given signal amplification course, a first time constant being used to determine the reference level, and
    superimposing on the predetermined signal amplification course in a determined operating point a signal amplification course, which will be followed based on a second time constant, the first time constant being greater than the second time constant.

2. The method according to claim 1, whereas a squelch or a noise suppression is being applied on input signals with a signal level that lies below the minimum input signal level.

3. The method according to claim 1, whereas a continuous gain function is provided for the signal amplification in the area of the minimum input signal level.

4. The method according to claim 2, whereas a continuous gain function is provided for the signal amplification in the area of the minimum input signal level.

5. The method according to claim 1, further comprising the steps of
    determining a maximum input signal level by adding a predetermined second difference value to the reference level of the input signal, and
    applying a signal limiting to the input signal with a signal level which lies above the maximum input signal level.

6. The method according to claim 2, further comprising the steps of
    determining a maximum input signal level by adding a predetermined second difference value to the reference level of the input signal, and
    applying a signal limiting to the input signal with a signal level which lies above the maximum input signal level.

7. The method according to claim 3, further comprising the steps of
    determining a maximum input signal level by adding a predetermined second difference value to the reference level of the input signal, and
    applying a signal limiting to the input signal with a signal level which lies above the maximum input signal level.

8. The method according to claim 4, further comprising the steps of
    determining a maximum input signal level by adding a predetermined second difference value to the reference level of the input signal, and
    applying a signal lifting to the input signal with a signal level which lies above the maximum input signal level.

9. The method according to one of the claims 1, 2, 3, 4, 6, 7, and 8, whereas a frequency range is divided in at least two frequency bands and whereas in each of the frequency bands a reference level of the input signal is being determined.

10. Method according to one of the claims 3, 4, 5, 6, 7, and 8, whereas the difference values are chosen to encompass the whole dynamic range of speech signals.

11. The method according to one of the claims 1, 2, 3, 4, 5, 6, 7, and 8, whereas a momentary mean value of the input signal level is being used as reference level.

12. A hearing device with an electro-acoustic converter to generate an input signal, which is fed to a signal processing unit, in which an output signal is generated, comprising a signal processing unit, in which
   a reference level of the input signal is being determined,
   a minimum input signal level is being determined by subtracting a given difference value from the reference level of the input signal, and
   an amplification function, which differs from the one being provided above the minimum input signal level, is being applied to the input signal with a level that lies below the minimum input signal level, whereas the reference level of the input signal is being used to determine the operating point on a given signal amplification source, a first time constant is being provided to determined the reference level, and whereas a signal amplification course is superimposed on the given signal amplification course in the determined operating point, the signal amplification course is being followed by a second time constant, the first time constant is being greater than the second time constant.

13. The hearing device according to claim 12, whereas a squelch or a noise suppression is being applied to input signals with a signal level, which lies below the minimum input signal level.

14. The hearing device according to claim 12, whereas the signal amplification is a continuous function in the area of the minimum signal level.

15. The hearing device according to claim 13, whereas the signal amplification is a continuous function in the area of the minimum input signal level.

16. The hearing device according to claim 12,
   whereas a maximum input signal level is being determined by adding a predefined second difference value to the reference level of the input signal, and
   whereas a signal limiting is being applied to input signals with a signal level that lies above the maximum input signal level.

17. The hearing device according to claim 13,
   whereas a maximum input signal level is being determined by adding a predefined second difference value to the reference level of the input signal, and
   whereas a signal limiting is being applied to input signals with a signal level that lies above the maximum input signal level.

18. The hearing device according to claim 14,
   whereas a maximum input signal level is being determined by adding a predefined second difference value to the reference level of the input signal, and
   whereas a signal limiting is being applied to input signals with a signal level that lies above the maximum input signal level.

19. The hearing device according to claim 15,
   whereas a maximum input signal level is being determined by adding a predefined second difference value to the reference level of the input signal, and
   whereas a signal limiting is being applied to input signals with a signal level that lies above the maximum input signal level.

20. The hearing device according to one of the claims 12, 13, 14, 15, 16, 17, 18, and 19, whereas a frequency range is divided into at least two frequency bands, and whereas in each of the frequency bands a reference level of the input signal is being determined.

21. The hearing device according to one of the claims 12, 13, 14, 15, 16, 17, 18, and 19, whereas the difference values are chosen to encompass the whole dynamic range of speech signals.

22. The hearing device according to one of the claims 12, 13, 14, 15, 16, 17, 18, and 19, whereas a momentary mean value of the input signal level is being used as reference level.

* * * * *